United States Patent
Walker et al.

(10) Patent No.: US 6,265,930 B1
(45) Date of Patent: Jul. 24, 2001

(54) GLITCH FREE CLOCK MULTIPLEXER CIRCUIT

(75) Inventors: Christopher Walker; Robin Parry, both of Watford; Justin A Drummond-Murray, Chorleywood, all of (GB)

(73) Assignee: 3Com Corporation, Santa Clara, CA (US)

( * ) Notice: Subject to any disclaimer, the term of this patent is extended or adjusted under 35 U.S.C. 154(b) by 0 days.

(21) Appl. No.: 09/562,953

(22) Filed: May 3, 2000

(30) Foreign Application Priority Data

Jan. 18, 2000 (GB) .................................................. 0001109

(51) Int. Cl.$^7$ .................................................. H03K 17/62
(52) U.S. Cl. .......................................... 327/407; 327/298
(58) Field of Search .................................. 327/407, 408, 327/411, 295, 298, 296; 326/93, 96; 370/535, 540, 541

(56) References Cited

U.S. PATENT DOCUMENTS

| | | | |
|---|---|---|---|
| 4,853,653 | 8/1989 | Maher | 33/9 |
| 5,056,120 | * 10/1991 | Taniguchi et al. | 375/371 |
| 5,315,181 | 5/1994 | Schowe | 326/93 |
| 5,357,146 | 10/1994 | Heimann | 327/292 |
| 6,194,939 | * 2/2001 | Omas | 327/298 |

FOREIGN PATENT DOCUMENTS 2 287 107    9/1995   (GB) .

* cited by examiner

*Primary Examiner*—Toan Tran
*Assistant Examiner*—Cassandra Cox
(74) *Attorney, Agent, or Firm*—Nixon & Vanderhye P.C.

(57) ABSTRACT

A clock selector circuit for selecting a single output clock signal from a multiplicity of input clock signals, each constituted by transitions between binary states, comprises a multiplicity of D-bistables each having a clock input coupled to receive the respective one of the input clock signals, a D-input coupled to receive a hold signal common to the bistables, and an output for providing a respective hold signal. A first multiplexer has inputs coupled to receive the respective input clock signals and is operative to select in response to the selection signal one of said input signals. A second multiplexer has inputs coupled to receive the respective hold signals and is operative to select in response to the selection signal the hold signal corresponding to the clock signal selected by the first multiplexer. A gate is coupled to receive both the clock signal selected by the first multiplexer and the hold signal selected by the second multiplexer and asserts an output whichever of the input signals to the gate may be asserted. The assertion of the common hold signal precedes a chance in state of the selection signal and endures at least until all the hold signals have been asserted and a change in state of the selection signal has occurred. The circuit facilitates glitch-free clock multiplexing.

3 Claims, 1 Drawing Sheet

GLITCH FREE CLOCK MULTIPLEXER CIRCUIT

FIELD OF THE INVENTION

This invention relates to the selection of a clock signal from a multiplicity of available clock signals.

There is a wide variety of circumstances wherein it is necessary or desirable to be able to select, by means of an appropriately coded signal, a clock signal from a multiplicity of clock signal sources. One important circumstance is in an application specific integrated circuit for use in switches or other packet-handling devices in packet-based data communication networks. However it is not intended to limit the invention by any particular context or usage.

The invention may for example be useful in network devices wherein a port may be clocked by an external clock, such as a recovered clock. It may be necessary to select between several such clocks if it is desired to multiplex between several data sources. It may also be necessary in addition to select from one or more internally generated clocks to implement loop-back or other test modes. Normally, if one did not have a guaranteed glitch-free clock multiplexer in these circumstances then the clocked circuitry would have to be reset whenever there was a change in the clock source. This generally necessitates a more complex design and may in some circumstances lead to loss of data.

BACKGROUND TO THE INVENTION

Selection schemes for clock signals exist in a wide variety of forms. A general problem in selection schemes of this nature is the achievement of switching from one clock source to another 'on the fly', that is to say asynchronously relative to any of the clocks without producing any 'glitches', that is to say undesirable transients such as spike pulses in the selected output clock signal. Various solutions to this general problem have been proposed. They generally involve negative edge clocking, asynchronous latches, asynchronously set and cleared flip-flops or gated clocks. Many designs employ some form of feedback path, for example a coupling from the output of a flip-flop to an input thereof. Although such feedback paths, exemplified by U.S. Pat. No. 4,853,653 to Maher may facilitate design from the point of view of minimising the number of gates, in general the existence of feedback paths make a design more difficult to simulate exhaustively and to analyse for edge conditions or lock-up states.

SUMMARY OF THE INVENTION

The invention is therefore primarily concerned with a selection scheme which is particularly suitable for implementation in an application specific integrated circuit having regard to the foregoing considerations.

In a preferred form of the invention, a circuit which can receive a multiplicity of clock signals is organised so that an output clock is forced 'high' by means of a hold signal synchronized to a currently selected clock source and is re-enabled by the removal of the hold signal, the removal of the signal being synchronous with the newly selected clock source. The effect of this arrangement is that the output clock will remain high for several clock cycles when the arrangement switches between clock sources but the 'low' intervals both before and after the long 'high' pulse will be of the correct length.

Further features of the invention will become apparent from the following detailed description with reference to the drawing.

BRIEF DESCRIPTION OF THE DRAWING

The single

DETAILED DESCRIPTION

Figure 1:
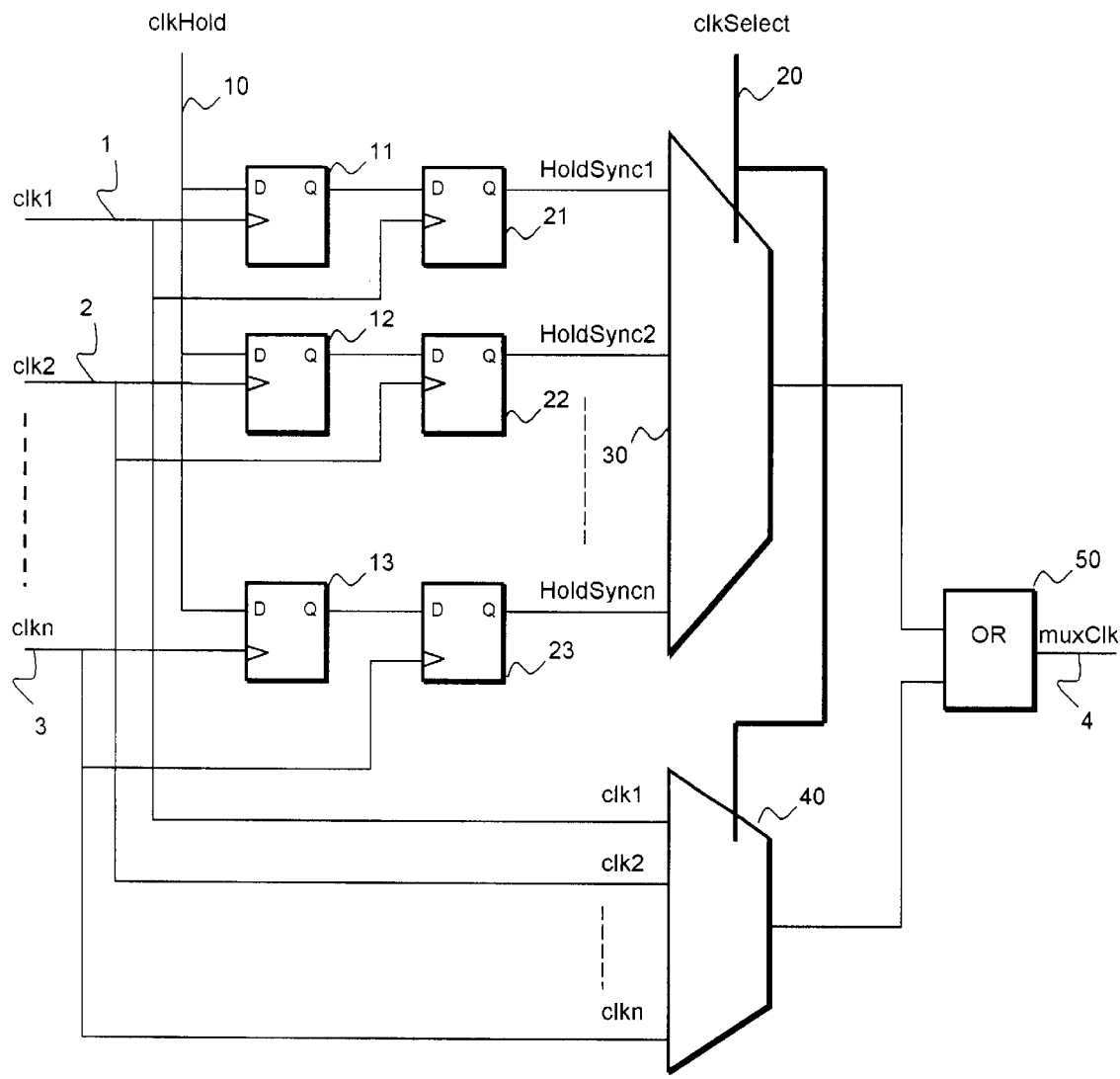
FIG. 1 is a schematic diagram of a clock selector system constituting one embodiment of the invention.

The single FIG. 1 illustrates a clock selector system which employs no negative edge clocking, asynchronous latches, asynchronously set and cleared flip-flops or gated clocks and furthermore does not include any feedback paths.

In the specific arrangement shown by way of example in FIG. 1, the lines 1, 2 and 3 convey clock signals, denoted 'clk1', 'clk2' and 'clkn' respectively. There may be any reasonable number of clocks, as denoted by the dashed lines. These clock signals are in a normal 'square wave' form constituted by relatively rapid transitions between two respective binary states. The purpose of the arrangement is to provide on an output line 4 a selected clock and to achieve switching between a current clock signal and a new clock signal such that there are no glitches in the output clock on line 4.

The main features of the circuit shown in FIG. 1 are the assertion of 'hold' signals in response to the respective clock signals and a common hold signal; two selector circuits each of which is operated in response to the clock selection signal and serves to select respectively the new clock signal and the respective hold signal; and an OR function applied to the outputs of the selectors so that the output signal on line 4 is asserted when either the selected hold signal or the new clock signal is asserted, the common hold signal being asserted for an appropriate period of time before a change in the select signal. The control signals providing the common 'hold' function and the 'select' function do not need to be synchronized to any of the input clocks and may employ an entirely different clock if this is desired.

The common hold signal, denoted 'clkHold' appears on a line 10 coupled to the D-input of each of a multiplicity of D-type flip-flops each receiving the respective input clock signal at its clock input. Thus in the simplified embodiment shown, clock signal line 1 is coupled to the clock input of D-type flip-flop 11, clock input line 2 is coupled to the clock input line of D-type 12 and clock input line 3 is connected to the clock input of D-type 13.

In this particular embodiment, to guard against the phenomenon known as metastability, there is a second set of D-type bistables, 21, 22 and 23, one for each of the input clocks. The D input of each of the second set of bistables is connected to receive the respective 'hold' signal from the Q output of the respective bistable in the first set whereas the clock input of the respective bistable in the second set is connected to receive the respective clock signal. Thus for example the D input of bistable 21 is coupled to the Q output of bistable 11 and the clock input of bistable 21 is connected to the clock input line 1. Bistable 22 is similarly connected to bistable 12 and clock input line 2 and so on.

The effect of the set of bistables or sets of bistables as in the specific example is to provide for each clock signal a respective hold signal, for example 'HoldSync1' for clock 1 and so on. When therefore the common signal 'clkHold' is asserted, by virtue of the D-type bistables the signals HoldSync1, HoldSync 2 are asserted when the respective clock is asserted (i.e. goes 'high').

The HoldSync signals are each coupled to a respective input of a selector (multiplexer) 30 of which the output is selectable by means of clock select signal (clkSelect)

appearing on a set of lines 20 and which may be, for example, in binary coded form.

The clock signals themselves are also applied to a selector (multiplexer) 40, each of the lines 1, 2 etc being connected to a respective input of multiplexer 40. This multiplexer is responsive to the clock select signal on line 20 in the same way as the multiplexer 30, so that the selection of a particular HoldSync signal by multiplexer 30 will be accompanied by the selection of the corresponding clock signal by multiplexer 40.

The final stage in the circuit is a gate constituted by an OR gate 50 which is coupled to receive the outputs of selectors 30 and 40 and has an output coupled to the output line 4.

As previously mentioned, when the signal 'clkHold' is asserted, the HoldSync signals are asserted and the HoldSync signal corresponding to the currently selected clock will be selected by the upper multiplexer 30. When this hold signal is asserted it will drive the respective input of the OR gate 50 'high' and thus cause the output signal 'muxClk' to go high. This event will occur immediately after the rising edge of the currently selected clock. Thus the selected HoldSync signal will force the output clock signal 'muxClk' to be high immediately after it has already executed a transition to the high state. Accordingly no glitch will appear in the output signal at this point.

The bistables will ensure that there is at least one clock cycle delay from the deassertion of 'clkHold' to the deassertion of the HoldSync signal, so that there is time for the clkSelect signal to settle and for the multiplexers to select the new HoldSync and clk signals.

At an appropriate time (t) as discussed below, after the clock hold signal has been asserted, all the HoldSync signals will have been asserted and the output clock signal will be held in the high state. The state of the clock select signal may now be changed and thereafter the clock hold signal can be deasserted. The change of the clock select signal will select a new clock source on the lower multiplexer 40. It will also select the associated HoldSync signal by means of the upper multiplexer 30. This hold signal will still be at the high value and accordingly the output clock signal will remain high. When the new value of the clock hold signal has been synchronized to the newly selected clock, the selected HoldSync signal will be deasserted. This event happens synchronously with the selected clock, gating the clock through while the clock is in its high state. Thus at this point also no glitch will occur.

Thus the output clock is forced high with a respective hold signal synchronized to the currently selected clock source and is re-enabled by the removal of the hold signal, the removal of the hold signal being synchronous to the newly selected clock source. The effect is that the output clock will remain 'high' for several clock cycles when switching between clock sources but the 'low' periods both before and after the long 'high' interval will be of the correct length and there will be no glitches at the switching transitions.

The clkHold and clkSelect signals need not be synchronized and may occur at any relative times. In the most extreme case, clkHold could go high just after the rising edge of one of the clocks. Not until almost one clock cycle later would a '1' be clocked into the respective one of the first bistables 11–13. One further clock cycle later would a '1' be clocked into the next bistable, causing the respective HoldSync signal to go 'high'. There should be an additional delay between the low-high transition of this HoldSync signal and any change in the value of clkSelect to avoid a glitch on the output clock. If this additional delay is one further clock cycle, the total delay (t) in this embodiment from the assertion of clkHold and a change in the value of clkSelect should be at least three clock cycles of the slowest clock frequency.

What is claimed is:

1. A clock selector circuit for selecting an output clock signal from a multiplicity of input clock signals, comprising:

(i) means for asserting and deasserting a respective one of a multiplicity of hold signals in response to the assertion and deassertion respectively of a common hold signal and the assertion of a respective one of the input clock signals;

(ii) means for selecting one of said input clock signals in response to the state of a selection signal;

(iii) means for selecting one of said multiplicity of hold signals in response to the state of said selection signal; and (iv) gating means for asserting an output signal in response to the assertion of either or both of the selected hold signal and the selected input clock signal;

wherein the assertion of the common hold signal precedes a change in state of the selection signal and endures at least until all the hold signals in said multiplicity of hold signals have been asserted and said change in state of the selection signal has occurred.

2. A clock selector circuit for selecting a single output clock signal from a multiplicity of input clock signals each constituted by transitions between binary states, the circuit comprising:

(i) a multiplicity of D-bistables each having a clock input coupled to receive the respective one of said input clock signals and a D-input coupled to receive a hold signal common to the bistables, and an output for providing a respective hold signal;

(ii) a first multiplexer having inputs coupled to receive the respective input clock signals and operative to select in response to a selection signal one of said input signals;

(iii) a second multiplexer having inputs coupled to receive the respective hold signals and to select in response to the selection signal the hold signal corresponding to the clock signal selected by the first multiplexer; and (iv) a gate coupled to receive both the clock signal selected by the first multiplexer and the hold signal selected by the second multiplexer and to assert and output whichever of the input signals to the gate may be asserted.

3. A circuit according to claim 2 and further comprising, between each of said D-bistables and the respective input of the second multiplexer, a respective further D-bistable which receives the respective hold signal at a D-input and the respective clock signal at a clock input and couples the respective hold signal to the said second multiplexer.

* * * * *